(12) United States Patent
Yousefbeiki et al.

(10) Patent No.: US 12,356,539 B2
(45) Date of Patent: Jul. 8, 2025

(54) LAMINATED ASSEMBLY COMPRISING RADIO-FREQUENCY INTERFACE BOARD

(71) Applicants: AGC GLASS EUROPE, Louvain-la-neuve (BE); AGC INC., Chiyoda Ku (JP); AGC FLAT GLASS NORTH AMERICA, INC., Alpharetta, GA (US); AGC VIDROS DO BRASIL LTDA, Sao Paulo (BR)

(72) Inventors: Mohsen Yousefbeiki, Gosselies Select (BE); Rafik Addaci, Gosselies Select (BE)

(73) Assignees: AGC GLASS EUROPE, Louvain-la-Neuve (BG); AGC INC., Chiyoda Ku (JP); AGC FLAT GLASS NORTH AMERICA, INC., Alpharetta, GA (US); AGC VIDROS DO BRADIL LTDA, Sao Paulo (BR)

( * ) Notice: Subject to any disclaimer, the term of this patent is extended or adjusted under 35 U.S.C. 154(b) by 169 days.

(21) Appl. No.: 18/248,631

(22) PCT Filed: Jun. 23, 2021

(86) PCT No.: PCT/EP2021/067198
§ 371 (c)(1),
(2) Date: Apr. 11, 2023

(87) PCT Pub. No.: WO2022/078638
PCT Pub. Date: Apr. 21, 2022

(65) Prior Publication Data
US 2023/0413420 A1  Dec. 21, 2023

(30) Foreign Application Priority Data
Oct. 12, 2020  (EP) ................................. 20201401

(51) Int. Cl.
*H05K 1/02* (2006.01)
*H01P 3/08* (2006.01)
(Continued)

(52) U.S. Cl.
CPC .............. *H05K 1/0237* (2013.01); *H01P 3/08* (2013.01); *H05K 1/0353* (2013.01); *H05K 3/4614* (2013.01); *H05K 2201/0145* (2013.01)

(58) Field of Classification Search
None
See application file for complete search history.

(56) References Cited

U.S. PATENT DOCUMENTS 3,546,539 A * 12/1970 Wilcox, Jr. .......... H05K 1/0287
 174/268
5,219,292 A   6/1993 Dickirson et al.
(Continued)

FOREIGN PATENT DOCUMENTS

CN   1316116 A * 10/2001  .............. H01P 1/047
CN   1518223 A *  8/2004  .......... H05K 1/0239
(Continued)

OTHER PUBLICATIONS

International Search Report issued Sep. 28, 2021 in PCT/EP2021/067198, filed on Jun. 23, 2021, 3 pages.

*Primary Examiner* — Binh B Tran
*Assistant Examiner* — Muhammed Azam
(74) *Attorney, Agent, or Firm* — Oblon, McClelland, Maier & Neustadt, L.L.P.

(57) ABSTRACT

An improved RF interface board and a laminated assembly having a RF interface board having an inner and an outer part. The laminated assembly includes a dielectric support having a first and a second surfaces and at least a first and a second RF transmission strips disposed on the dielectric support. The first and the second RF transmission strips are (Continued)

electrically isolated from each other, are configured to be connected to a connector at the outer part, and are each configured to be connected to a different conductive element at the inner part. The first RF transmission strip is on the first surface of the dielectric support.

13 Claims, 4 Drawing Sheets

(51) Int. Cl.
*H05K 1/03* (2006.01)
*H05K 3/46* (2006.01)

(56) References Cited

U.S. PATENT DOCUMENTS

| | | | | |
|---|---|---|---|---|
| 5,471,181 | A * | 11/1995 | Park | H01P 5/028 |
| | | | | 333/260 |
| 7,855,623 | B2 * | 12/2010 | Green | H01P 1/20372 |
| | | | | 333/204 |
| 7,978,029 | B2 * | 7/2011 | Conn | H01P 3/08 |
| | | | | 333/246 |
| 8,519,989 | B2 * | 8/2013 | Nakamura | H05K 3/368 |
| | | | | 345/204 |
| 8,847,696 | B2 * | 9/2014 | Blair | H01P 3/00 |
| | | | | 333/34 |
| 9,203,193 | B2 * | 12/2015 | Hackman | H01R 13/648 |
| 10,044,085 | B2 * | 8/2018 | Ma | H01P 3/08 |
| 10,694,618 | B2 * | 6/2020 | Coakley | H05K 1/0237 |
| 11,399,434 | B2 * | 7/2022 | Pon | H05K 1/141 |
| 2005/0063135 | A1 * | 3/2005 | Borland | H01G 4/255 |
| | | | | 361/303 |
| 2005/0064732 | A1 | 3/2005 | Muench | |
| 2005/0225492 | A1 * | 10/2005 | Metz | H01Q 3/26 |
| | | | | 343/753 |
| 2006/0084285 | A1 | 4/2006 | Muench | |
| 2013/0025922 | A1 * | 1/2013 | Weibezahn | H05K 3/34 |
| | | | | 29/840 |
| 2023/0413420 | A1 * | 12/2023 | Yousefbeiki | H01P 3/006 |

FOREIGN PATENT DOCUMENTS

| | | | | |
|---|---|---|---|---|
| CN | 107578703 | A * | 1/2018 | H01L 27/3244 |
| CN | 111446532 | A * | 7/2020 | H01P 1/2053 |
| CN | 115707171 | A * | 2/2023 | |
| GB | 2166603 | A * | 5/1986 | B60R 16/0207 |
| JP | 61050118 | A * | 3/1986 | |
| JP | H0669842 | | * 3/1994 | |
| KR | 20060009926 | A * | 2/2006 | |
| TW | I434635 | | * 4/2014 | |

* cited by examiner

LAMINATED ASSEMBLY COMPRISING RADIO-FREQUENCY INTERFACE BOARD

This application is a 371 application of PCT/EP2021/067198 filed Jun. 23, 2021 and claims benefit of EP 20201401.5, filed Oct. 12, 2020. The contents of each of these applications are incorporated herein by reference.

TECHNICAL FIELD

The present invention relates to a laminated assembly connected with at least an Radio Frequency (RF) interface board.

The invention is preferably used to feed an laminated assembly encompassing an antenna and especially a patch antenna.

Thus, the invention concerns multiple domains where laminated assembly including at least one RF interface board is used.

BACKGROUND ART

To emit an RF signal to and/or to receive an RF signal from an antenna a transmission line, for example a coaxial cable, needs to be connected between the antenna and the RF module. Sometimes, to avoid to connect directly the cable to the antenna, an RF connector is used.

A connector has a standardized male/female terminal and the connector is soldered and/or screwed to the conductive parts of the antenna. In a second time, the cable is fixed to this terminal.

Therefore, each application and/or antenna needs a specific connector to be soldered at the right place.

Antennas can be classified as omnidirectional, radiating energy approximately equally in all directions, or directional, where energy radiates more along one direction than others. A "directional" antenna usually is intended to maximize its coupling to the electromagnetic field in the direction of the other station.

Antennas can be made of conductive wire, for example for FM, AM signal. These wires can be placed in the space or printed on a dielectric support. Antennas can be more complex needing several conductive elements in relation to each other, for example a patch antenna. In the case of patch antenna, for example, the antenna comprises at least three elements, a patch, a feed line, and a ground plane. To achieve a set of specific performance criteria, specific spacing between the patch and/or the feed line and the ground plane is needed.

Other types of conductive systems may need an isolated specific distance between two conductive elements.

The document EP3289638 discloses a connector between two conductive elements and a coaxial cable. This connector pinches the cable to electrically connect the cable and the two conductive elements and cannot be used inside a laminated structure because of its size and volume.

The document EP3478497 discloses the use of a flat and flexible connector to connect the inside of a laminated structure. This connector can only connect to one surface of a laminated structure. When several conductive elements on different surfaces need to be connected to the outside of the structure, each conductive element need its own interface. Thus, especially for an antenna application, a very customized connector is needed to feed the conductive elements present inside the laminated structure. Furthermore, the impedance matching of the antenna becomes more challenging due to subsequent parasitic capacitive and inductive loadings.

SUMMARY OF INVENTION

The present invention relates, in a first aspect, to an RF interface board, having an inner and an outer part, comprising a dielectric support having a first and a second surface and at least a first and a second RF transmission strips disposed on the dielectric support; the first and the second RF transmission strips are electrically isolated from each other; the first and the second RF transmission strips are configured to be connected to an RF connector at the outer part and are each configured to be connected to a different conductive element at the inner part; the first RF transmission strip is on the first surface.

The first and the second surface are substantially parallel and substantially flat.

The present invention relates, in a second aspect, to a laminated assembly comprising a first and a second dielectric panels laminated together by a polymeric-based interlayer; each of the first and the second dielectric panels has an internal surface; the internal surfaces are facing together; at least a first and a second conductive elements; the first conductive element is disposed on the internal surface of the first dielectric; the two conductive elements are isolated from each other and an RF interface board, having an inner and an outer part comprising a dielectric support having a first and a second surface; and at least a first and a second RF transmission strips disposed on the dielectric support; the first and the second RF transmission strips are electrically isolated from each other.

The first and the second surface of the inner part of the RF interface board are substantially flat and parallel to each other. The first RF transmission strip is electrically connected to the first conductive element at the inner part of the dielectric support and the second RF transmission strip is electrically connected to the second conductive element at the inner part of the dielectric support. Preferably, the RF interface board has substantially the same thickness along the whole surface.

According to the present invention, on the outer part of the RF interface board a set of matching components, for example capacitors and inductors and/or their equivalent distributed-element circuits, can be connected to the RF transmission strips (between the place the coaxial cable or the RF connector is attached and the edge of the laminated assembly) in order to tune the impedance response of the laminated assembly.

According to the present invention, on the outer part of the RF interface board the RF module partially or entirely can be directly connected to the RF transmission strips.

The present invention also relates to a method for electrically connecting a laminated assembly according to the second aspect of the present invention, wherein the method comprises a step of connecting the shield of a coaxial cable to the first RF transmission strip at the outer part of the dielectric support and the core of the coaxial cable to the second RF transmission strip at the outer part of the dielectric support.

Finally, the present invention relates to the use of an RF interface board according to the first aspect of the present invention for connecting a connector or soldering a cable to transmit and/or receive RF signal to the outside of a laminated assembly.

It is noted that the invention relates to all possible combinations of features recited in the claims or in the described embodiments.

The following description relates to building applications but it's understood that the invention may be applicable to others fields like automotive or transportation applications.

BRIEF DESCRIPTION OF THE DRAWINGS

This and other aspects of the present invention will now be described in more detail, with reference to the appended drawings showing various exemplifying embodiments of the invention which are provided by way of illustration and not of limitation. The drawings are a schematic representation and not true to scale. The drawings do not restrict the invention in any way. More advantages will be explained with examples.

DETAILED DESCRIPTION

Figure 1:
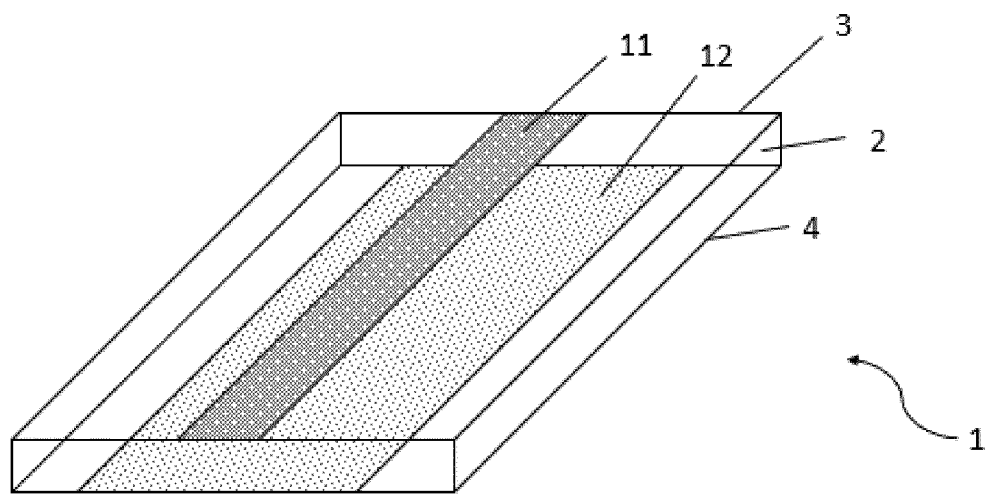
FIG. 1 is a schematic 3D view of a RF interface board comprising a first RF transmission strip on the first surface and a second RF transmission strip on the second surface.

It is an object of the present invention to alleviate the above described problems and to minimize the number of needed compounds for feeding an laminated assembly. Especially, the object of the first aspect of the present invention is to improve the connection inside a laminated assembly.

Another advantage of the present invention is to minimize the number of customized connectors while giving the possibility to use commercially-available connectors.

According to a first aspect of the invention, the invention relates to an improved RF interface board 1, 140 having an inner 141 and an outer 142 part, comprising
- a dielectric support 2, 150 having a first 3, 151 and a second 4, 152 surfaces and
- at least a first 11, 161 and a second 12, 162 RF transmission strips disposed on the dielectric support; the first and the second RF transmission strips are electrically isolated from each other; the first and the second RF transmission strips are configured to be connected to an RF connector at the outer part and are each configured to be connected to a different conductive element at the inner part; the first RF transmission strip is on the first surface.

The first and the second surface are substantially parallel and substantially flat meaning that the dielectric support has a generic 3D shape of a rectangular parallelepiped.

FIGS. 1 to 4 illustrates several embodiments according to the first aspect of the present invention.

FIG. 1 illustrates a RF interface board 1 according to a first embodiment where the first RF transmission strip 11 on the first surface 3 and the second RF transmission strip 12 is on the second surface 4. This embodiment allows to replace in a laminated assembly two prior-art connectors by only one RF interface board meaning that the handling, the process of manufacture such laminated assembly are simplified and the price will be lower.

Figure 2:
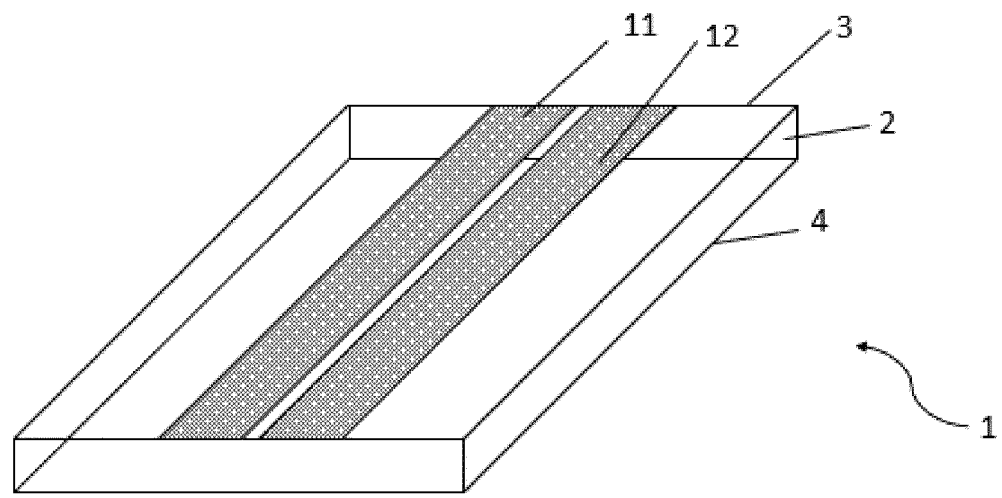
FIG. 2 is a schematic 3D view of a RF interface board comprising a first RF transmission strip and a second RF transmission strip on the first surface.

In some embodiments, as illustrated by FIG. 2, the RF interface board 1 comprises the first RF transmission strip 11 and the second RF transmission strip 12 is on the first surface 3. In these embodiments, a single flat prior-art connector could be used but flat connectors are flexible, thus they can be easily folded and broken.

Figure 3:
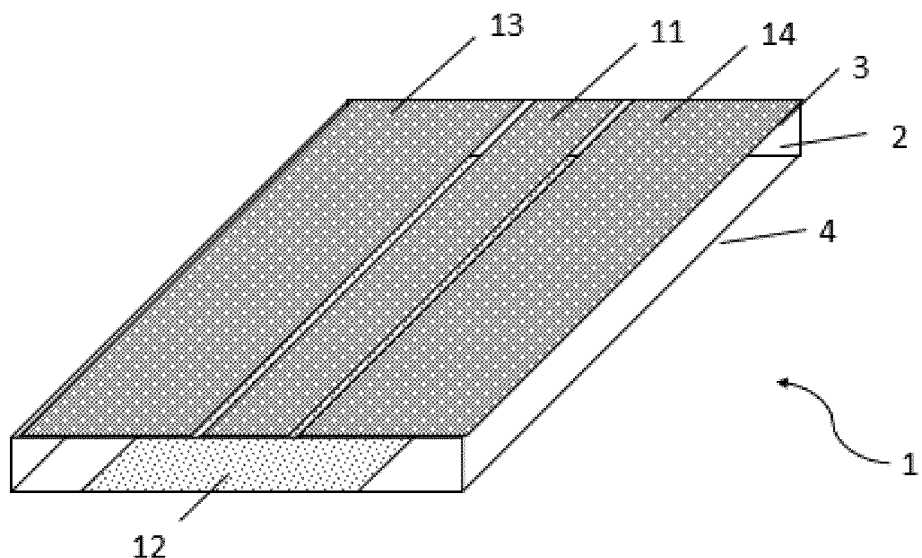
FIG. 3 is a schematic 3D view of a RF interface board comprising a first RF transmission strip and two others (a third and a fourth) RF transmission strips on the first surface and a second RF transmission strip on the second surface.

In some embodiments, as illustrated by FIG. 3, the RF interface board 1 comprises the first RF transmission strip 11 on the first surface 3 and the second RF transmission strip 12 on the second surface 4. Two other RF transmission strips 13, 14 are placed on the first surface. All RF transmission strips are electrically isolated from each other. These embodiments can be used for an assembly fed via a grounded CPW. These embodiments allows to replace in a laminated assembly two and/or four prior art connectors by only one RF interface board meaning that the handling, the process of manufacture such laminated assembly are simplified and the price will be lower.

Figure 4:
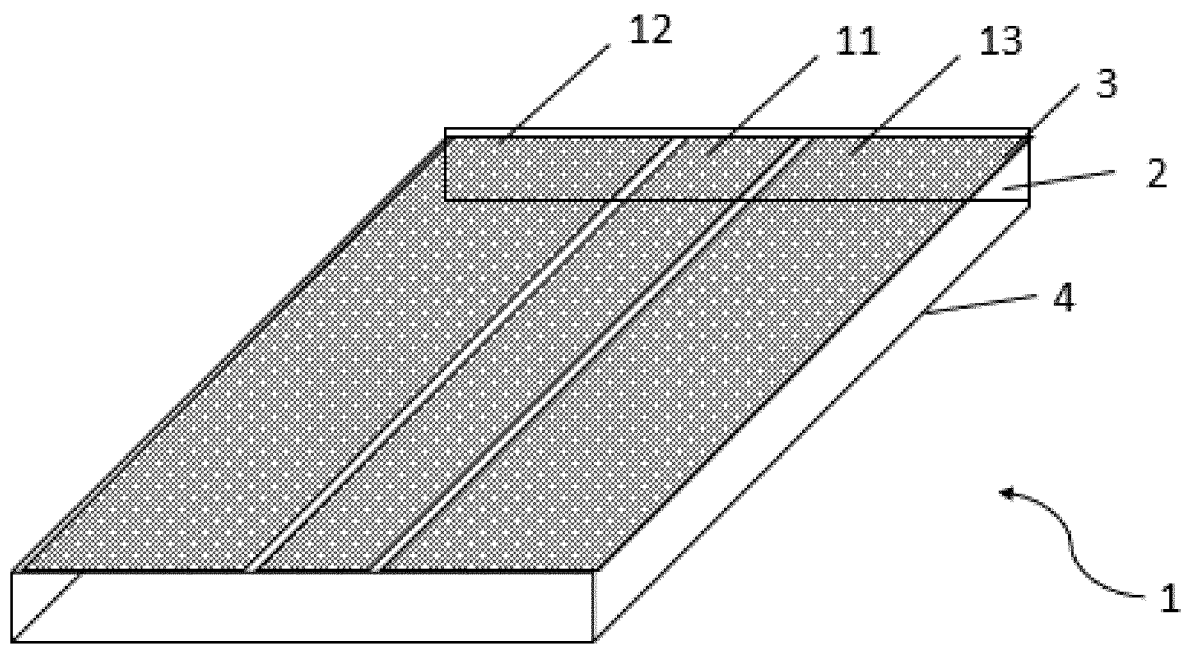
FIG. 4 is a schematic 3D view of a RF interface board comprising a first RF transmission strip, a second RF transmission strip and a third RF transmission strip on the first surface.

In some embodiments, as illustrated by FIG. 4, the RF interface board 1 comprises the first RF transmission strip 11 on the first surface 3. The second RF transmission strip 12 is also placed on the first surface 4 as a third RF transmission line 13. All RF transmission strips are electrically isolated from each other. These embodiments can be used for an assembly fed via a CPW.

In some embodiments, the RF interface board has a length comprised between 20 mm and 40 mm, preferably between 20 mm and 30 mm, more preferably around 25 mm. the RF interface board has a width comprised between 5 mm and 20 mm, preferably around 10 mm or 12 mm.

In some embodiments, the thickness of the RF interface board is lower than 2 mm, preferably lower than 1 mm and more preferably the thickness is between 0.7 mm and 0.8 mm.

In some embodiments, the RF interface board is rigid to ensure the electrical connection to the conductive elements while ensuring the connection to the coaxial cable. For mounting purpose, in some other embodiments, the RF interface board is flexible and has a flexural strength of at most 150 MPa.

The dielectric support can be made of a plastic-based dielectric material, such as FR4, Teflon-based, ceramic-based material or a glass based material such as soda-lime glass.

The dielectric support can be a multilayered dielectric support.

RF transmission strips can be printed, glued, coated on the dielectric support or placed by any other methods able to non-removably place a strip on a dielectric support. RF transmission strips are conductive to be able to feed a conductive element placed in a laminated assembly. Material of the RF transmission strip can be metal-based material such as Copper, Silver, conductive metal alloys with or without plated material, such as gold, or any other material able to be electrically conductive and able to be placed on a dielectric support as described above.

In some embodiments, at the outer part, a RF transmission strip can be transferred from one surface of the RF interface board to the other surface to be easily connected. Such transfer can be made through metallic via.

Preferably, the width of strips is between 1 mm and 3 mm for narrow strips and between 6 mm and 10 mm for wide strips. In FIGS. 1 and 3, the strip 11 can be considered as a narrow strip compared to width of the RF interface board and the wide strip 12. In FIG. 2, strips 11 and 12 can be considered as narrow compared to the width of the RF interface board. According to a second embodiment of the present invention, the invention relates to an improved laminated assembly 100 comprising a first 101 and a second 102 dielectric panels laminated together by a polymeric-based interlayer 110; each of the first 101*i* and the second 102*i* dielectric panels has an internal surface; the internal surfaces are facing together.

The laminated assembly also comprises at least a first 121 and a second 122 conductive elements; the first conductive element is disposed on the internal surface of the first dielectric; the two conductive elements are isolated from each other.

The laminated assembly also comprises an RF interface board 140, according the first aspect of the present invention, having an inner 141 and an outer 142 part comprising a dielectric support 150 having a first 151 and a second 152 surface; and at least a first 161 and a second 162 RF transmission strips disposed on the dielectric support; the first and the second RF transmission strips are electrically isolated from each other.

The first and the second surface of the RF interface board are substantially flat and parallel to each other. The first RF transmission strip is electrically connected to the first conductive element at the inner part of the dielectric support and the second RF transmission strip is electrically connected to the second conductive element at the inner part of the dielectric support.

Figure 5:
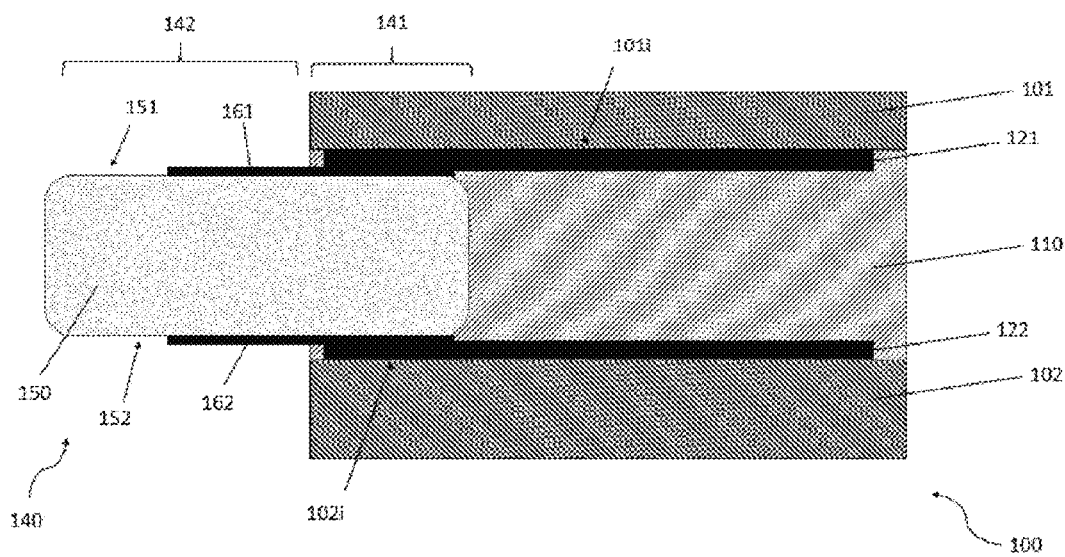
FIG. 5 is a schematic view of a laminated assembly comprising a first conductive element on the first internal surface and a second conductive element on the second internal surface and a RF interface board comprising a first RF transmission strip on the first surface and a second RF transmission strip on the second surface.

As illustrated in FIG. 5, the second RF transmission strip 162 is placed on the second surface 152 of the dielectric support 150 of the RF interface board 140 and the second conductive element 122 is disposed on the internal surface 102*i* of the second dielectric 102. This permits to replace at least two prior-art connectors by a single RF interface board meaning that the handling, the process of manufacture such laminated assembly are simplified and the price will be lower.

Figure 6:
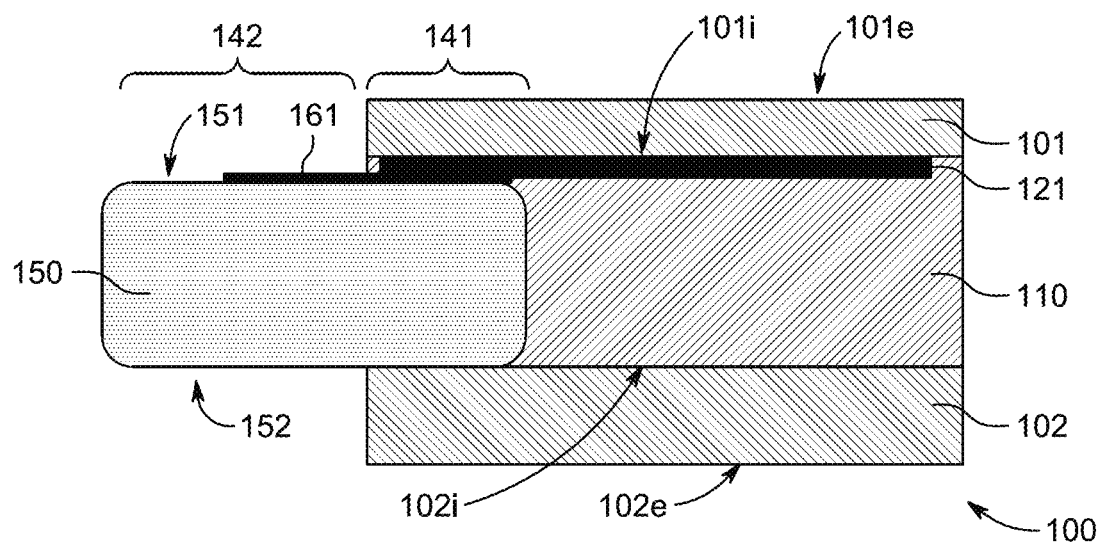
FIG. 6 is a schematic view of a laminated assembly comprising a first conductive element and a second conductive element (not shown) on the first internal surface and a RF interface board comprising a first RF transmission strip and a second RF transmission strip (not shown) on the first surface.

As illustrated in FIGS. 5 and 6, The RF interface board 150 has an inner 141 and an outer 142 parts. The inner part 141 is defined as the part of the RF interface board 150 is sandwiched between the first 101 and the second 102 dielectric panels. The outer part 142 is defined as the part of the RF interface board 150 not sandwiched between the first 101 and the second 102 dielectric panels. That means that the inner part of the RF interface board is at least partially laminated with the first and the second dielectric panels by the polymeric based interlayer. In some embodiments, the length of the inner part 141 corresponds to the width of the RF interface board 150. More preferably, the length of the inner part is about 10 mm.

In some preferred embodiments, to ensure the tightness of the laminated assembly, the polymeric-based interlayer has at least one cut-off in a border where the RF interface board is placed. Preferably, the width and/or the length of the cut-off is equals to or greater than the width of the inner part of the RF interface board. More preferably, the length and the width of the cut-off is substantially equals to the length and the width of the inner part of the RF interface board. To ensure the electrical connection, at least the inner part of the RF interface board has substantially the same thickness than the thickness of the interlayer.

According to the invention, the laminated assembly means that the two dielectric panels are assembled together by a polymeric-based interlayer via any known lamination process. The interlayer is typically polyvinyl butyral (PVB) or ethylene-vinyl acetate (EVA) for which the stiffness can be tuned. These interlayers keep the glass panels bonded together even when broken in such a way that they prevent the glass from breaking up into large sharp pieces. In a preferred embodiment, the polymeric-based interlayer is a cyclo-olefin polymer (COP) or ionomer-based interlayer to reduce the electrical loss tangent.

A dielectric panel is a panel that is not electrically conductive. The first and the second dielectric panel can have different chemical composition, such as plastic-based composition like PET-based composition or comprising at least 50% in weight of $SiO_2$ such as glass like soda lime glass, different thickness, . . . . In some embodiments, the first and the second dielectric panels have the same chemical composition to reduce the handling and the process of manufacturing.

The conductive element is an element to be placed on a surface of a dielectric panel that is electrically conductive. According to some embodiments, said conductive elements can be wires or surface. Preferably, the conductive element is a printed or coated surface.

According to the invention, the conductive element is a part of an antenna; one of the first or the second conductive element is the feed line and the other conductive element is the ground plane.

A printed surface is a surface where a conductive element is printed on by any known method such as screen-printing, inkjet printing, deposition, glued wire, copper foil, copper mesh, etc. In some embodiments, a copper based paste is printed with the corresponding shape on the surface of the dielectric panel.

A coated surface is a surface where a coating system is coated on. A coating system is thin and mainly transparent to eyes. The coating system can covering most of the surface of the dielectric panel. Preferably, the coating system is made of layers of different materials and at least one of these layers is electrically conductive. In such embodiments, the electrically conductive layer has to be in electrical contact or at a very small distance to be coupled with the corresponding RF transmission strip to be able to be fed.

A suitable coating system is for example, a conductive layer. A suitable conductive film, is for example, a laminated layer obtained by sequentially laminating a transparent dielectric, a metal layer, and a transparent dielectric, ITO, fluorine-added tin oxide (FTO), or the like. A suitable metal film can be, for example, a film containing as a main component at least one selected from the group consisting of Ag, Au, Cu, and Al.

Such coating systems typically are a system of thin layers comprising one or more, for example two, three or four, functional layers based on an infrared radiation reflecting material and at least two dielectric coatings, wherein each functional layer is surrounded by dielectric coatings. The coating system of the present invention may in particular have an emissivity of at least 0.010. The functional layers are generally layers of silver with a thickness of some nanometers, mostly about 5 to 20 nm. The dielectric layers are generally transparent and made from one or more layers of metal oxides and/or nitrides. These different layers are deposited, for example, by means of vacuum deposition techniques such as magnetic field-assisted cathodic sputtering, more commonly referred to as "magnetron sputtering". In addition to the dielectric layers, each functional layer may be protected by barrier layers or improved by deposition on a wetting layer.

According to some embodiments, the laminated assembly may comprise a tightness means placed around the RF interface board at the border of the assembly to ensure the tightness. The tightness means could be material a plastic based material or deposited by coating. Preferably, the tightness means is a sealant. More preferably, the tightness means is a transparent sealant.

In some preferred embodiments, the laminated assembly comprises a first protection panel assembled with the first dielectric panel 101.

In some embodiments, the laminated assembly comprises a second protection panel assembled with the second dielectric panel 102.

Preferably, the first and/or the second protection layer is respectively laminated with the first 101 and/or the second 102 dielectric panel by a protection interlayer on the external surface 101e, 102e facing the internal surface 101i, 102i. More preferably, the protection interlayer has the same composition that the polymeric-based interlayer 110.

Said protection layers can be made of glass, polycarbonate, PVC or any other material used to protect such laminated assembly.

Usually, the material of the protection layers is, for example, soda-lime silica glass, borosilicate glass, aluminosilicate glass or other materials such as thermoplastic polymers or polycarbonates. References to glass throughout this application should not be regarded as limiting.

The protection layers can be manufactured by a known manufacturing method such as a float method, a fusion method, a redraw method, a press molding method, or a pulling method. From the viewpoint of productivity and cost, it is preferable to use the float method.

Each protection layer can be independently processed and/or colored, . . . and/or have different thickness in order to improve the aesthetic, thermal insulation performances, safety, . . . . The thickness of the protection layer is set according to requirements of applications.

The protection layers can be processed, ie annealed, tempered, . . . to respect the specifications of security. The window can independently be a clear glass or a colored glass, tinted with a specific composition of the glass or by applying an additional coating or a plastic layer for example. The protection layer can have any shape to fit to the opening such as a rectangular shape, in a plan view by using a known cutting method.

In laminated assemblies, prior-art connectors are usually flexible and flat connectors. These flat and flexible connectors causes delamination between the dielectric panel and the interlayer because the connector is placed between the dielectric panel and the interlayer. It can causes also bubbling during the lamination process.

Figure 7:
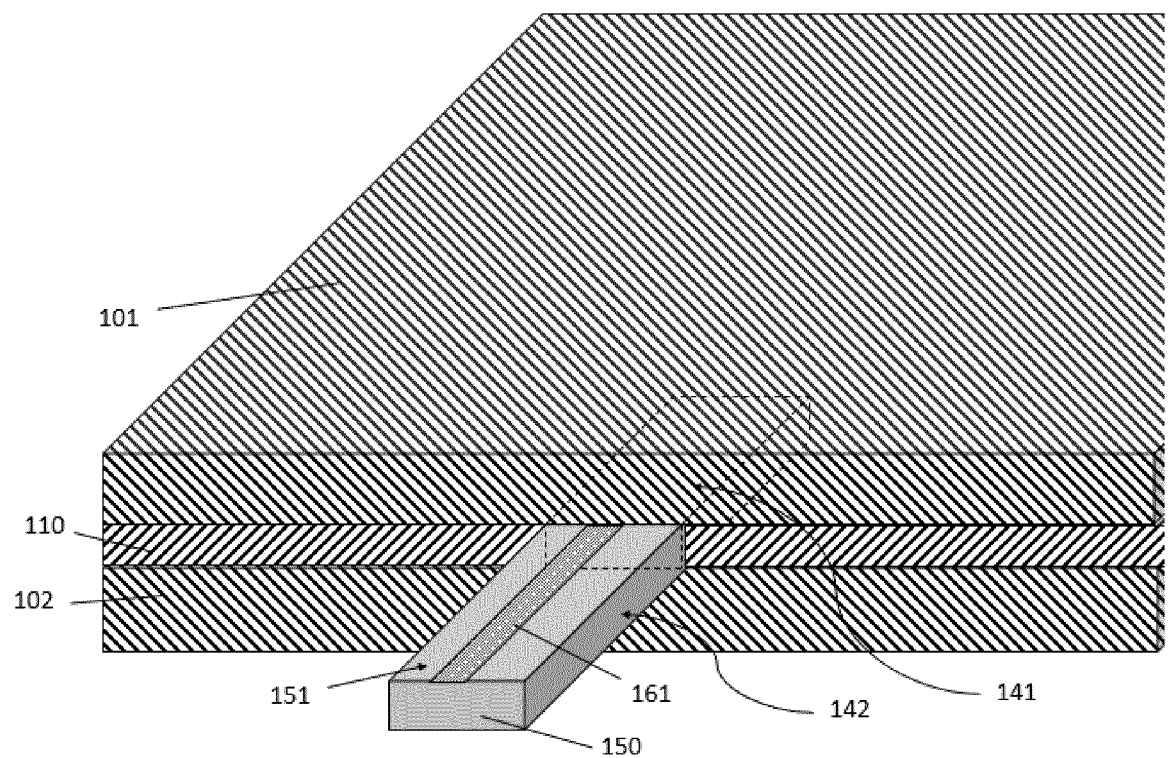
FIG. 7 is a schematic 3D view of a laminated assembly according to the invention.

As illustrated in FIG. 7, the inner part 141 of the RF interface board 150 is at least partially laminated with the first 101 and the second 102 dielectric panels by the polymeric based interlayer 110. The polymeric based interlayer 110 is in contact with lateral surfaces of the inner parts.

To manufacture a laminated assembly according to the invention, the first 101 and the second 102 dielectric panels are laminated with the RF interface board 150 by the polymeric based interlayer 110 with a known process such as vacuum bag process. In some embodiments, the polymeric based interlayer can comprises a notch to welcome the inner part of the RF interface board as illustrated in FIGS. 5, 6 and 7.

The invention claimed is:

1. A laminated assembly comprising:
   first and second dielectric panels laminated together by a polymeric-based interlayer, each of the first and the second dielectric panels having an internal surface, and the internal surfaces of the first and second dielectric panels facing each other;
   at least first and second conductive elements, the first conductive element disposed on the internal surface of the first dielectric panel, the first and second conductive elements being isolated from each other; and
   an RF interface board, having an inner and an outer part; the inner part being at least partially laminated with the first and the second dielectric panels by the polymeric based interlayer comprising
      a dielectric support having a first and a second surface; and
      at least a first and a second RF transmission strips disposed on the dielectric support, the first and the second RF transmission strips being electrically isolated from each other,
   wherein a first surface and a second surface of the inner part of the RF interface board are substantially flat and parallel to each other, and
   wherein the first RF transmission strip is electrically connected to the first conductive element at an inner part of the dielectric support and the second RF transmission strip is electrically connected to the second conductive element at the inner part of the dielectric support.

2. The laminated assembly according to claim 1, wherein the second RF transmission strip of the RF interface board is on the first surface of the dielectric support.

3. The laminated assembly according to claim 1, wherein the second RF transmission strip of the RF interface board is on the second surface of the dielectric support.

4. The laminated assembly according to claim 1, wherein the RF interface board comprises a third RF transmission strip disposed on the dielectric support and isolated from the first and second RF transmission strips.

5. The laminated assembly according to claim 1, wherein the second conductive element is disposed on the internal surface of the first dielectric panel and the second conductive element is electrically isolated from the first conductive element.

6. The laminated assembly according to claim 1, wherein the second conductive element is disposed on the internal surface of the second dielectric panel.

7. The laminated assembly according to claim 6, wherein the second RF transmission strip is on the second surface of the inner part of the RF interface board.

8. The laminated assembly according to claim 1, wherein the at least first and second conductive elements are coating systems comprising at least a conductive layer.

9. The laminated assembly according to claim 1, wherein the polymeric-based interlayer is a COP or ionomer-based interlayer.

10. The laminated assembly according to claim 1, wherein the first and/or the second dielectric panel is a PET-based panel.

11. A method for electrically connecting a laminated assembly according to claim 1, wherein the method comprises connecting a shield of a coaxial cable to the first RF transmission strip at an outer part of the dielectric support and a core of the coaxial cable to the second RF transmission strip at the outer part of the dielectric support.

12. A method for electrically connecting a laminated assembly according to claim 1, comprising connecting a commercially-available connector to the first RF transmission strip and to the second RF transmission strip disposed on the dielectric support.

13. An RF interface board for connecting a connector or soldering a cable to transmit and/or receive an RF signal to an outside of a laminated assembly, the laminated assembly comprising:
    first and second dielectric panels laminated together by a polymeric-based interlayer, each of the first and the second dielectric panels having an internal surface, and the internal surfaces of the first and second dielectric panels facing each other; and
    at least first and second conductive elements, the first conductive element being disposed on the internal surface of the first dielectric panel and the two conductive elements being isolated from each other,
    the RF interface board having an inner and an outer part, comprising
        a dielectric support having first and second surfaces, and
        at least first and second RF transmission strips disposed on the dielectric support, the first and the second RF transmission strips being electrically isolated from each other, the first and the second RF transmission strips configured to be connected to an RF connector or to an RF module at an outer part of the RF transmission strips and each configured to be connected to a different conductive element at an inner part of the RF transmission strips, the first RF transmission strip being on the first surface of the dielectric support,
    wherein the first and the second surfaces of the dielectric support are substantially parallel and substantially flat, and
    wherein the inner part of the RF interface board is at least partially laminated with the first and the second dielectric panels by the polymeric based interlayer.

* * * * *